(12) United States Patent
Miller

(10) Patent No.: US 10,114,211 B2
(45) Date of Patent: Oct. 30, 2018

(54) ENHANCED RESOLUTION DLP PROJECTOR APPARATUS AND METHOD OF USING SAME

(71) Applicant: STRATASYS LTD., Rehovot (IL)

(72) Inventor: Gershon Miller, Rehovot (IL)

(73) Assignee: STRATASYS LTD., Rehovot (IL)

( * ) Notice: Subject to any disclaimer, the term of this patent is extended or adjusted under 35 U.S.C. 154(b) by 0 days.

(21) Appl. No.: 15/951,545

(22) Filed: Apr. 12, 2018

(65) Prior Publication Data

US 2018/0231766 A1    Aug. 16, 2018

Related U.S. Application Data

(62) Division of application No. 14/774,142, filed as application No. PCT/IL2014/050275 on Mar. 13, 2014, now Pat. No. 10,001,641.

(Continued)

(51) Int. Cl.
*G02B 26/08* (2006.01)
*G03F 7/20* (2006.01)
(Continued)

(52) U.S. Cl.
CPC ........ *G02B 26/0833* (2013.01); *B29C 64/129* (2017.08); *B29C 64/135* (2017.08);
(Continued)

(58) Field of Classification Search
CPC ... B29C 64/277; B29C 64/282; B29C 64/135; B29C 64/106; B29C 64/129; B29C 64/124; B29C 64/264
See application file for complete search history.

(56) References Cited

U.S. PATENT DOCUMENTS 6,001,297 A * 12/1999 Partanen ................ B29C 64/40
264/308
6,038,067 A    3/2000 George
(Continued)

FOREIGN PATENT DOCUMENTS

CN    1695076    12/2005
CN    101937165    1/2011
(Continued)

OTHER PUBLICATIONS

Office Action dated Sep. 11, 2018 from corresponding Japanese application No. 2015-562557.

*Primary Examiner* — Jason L Lazorcik
(74) *Attorney, Agent, or Firm* — Pearl Cohen Zedek Latzer Baratz LLP

(57) ABSTRACT

A DLP projector apparatus is provided for projecting a monochromatic display from plurality of monochromatic light sources. The DLP projector is adapted to radiate from each micromirror of its DMD chip an image comprising a plurality of radiated locations which are shifted with respect to each other. The DLP projector apparatus comprise a controller unit that is adapted to control the radiation from the plurality of light sources to the image according to a radiation scheme in an object production file. A DLP projector apparatus is also provided comprising an imaging table that is adapted to be moved in a plane perpendicular to an imaging beam of the projector. The movements of the table are coordinated and synchronized with the imaging scheme of the projector. The imaging scheme and the movements of the table are controlled according to a radiation scheme in an object production file.

5 Claims, 4 Drawing Sheets

US 10,114,211 B2

Page 2

Related U.S. Application Data

(60) Provisional application No. 61/782,475, filed on Mar. 14, 2013.

(51) Int. Cl.
*B33Y 30/00* (2015.01)
*B29C 64/135* (2017.01)
*B29C 64/282* (2017.01)
*G03B 21/20* (2006.01)
*B33Y 40/00* (2015.01)
*H04N 9/31* (2006.01)
*B29C 64/129* (2017.01)
*B29C 64/277* (2017.01)
*G03B 21/00* (2006.01)
*B29C 64/20* (2017.01)

(52) U.S. Cl.
CPC .......... *B29C 64/277* (2017.08); *B29C 64/282* (2017.08); *B33Y 30/00* (2014.12); *B33Y 40/00* (2014.12); *G03B 21/2013* (2013.01); *G03B 21/2033* (2013.01); *G03F 7/70058* (2013.01); *H04N 9/3188* (2013.01); *B29C 64/20* (2017.08); *G03B 21/008* (2013.01)

(56) References Cited

U.S. PATENT DOCUMENTS

| | | | |
|---|---|---|---|
| 6,399,010 B1* | 6/2002 | Guertin | G05B 19/4099 264/308 |
| 6,500,378 B1* | 12/2002 | Smith | B29C 35/08 264/308 |
| 6,923,634 B2 | 8/2005 | Swanson et al. | |
| 7,167,296 B2 | 1/2007 | Meisburger | |
| 7,790,093 B2 | 9/2010 | Shkolnik et al. | |
| 8,398,247 B2 | 3/2013 | Miyazaki | |
| 9,073,261 B2 | 7/2015 | El-Siblani et al. | |
| 10,001,641 B2* | 6/2018 | Miller | G02B 26/0833 |
| 2005/0129941 A1 | 6/2005 | Comb et al. | |
| 2005/0248062 A1* | 11/2005 | Shkolnik | G03F 7/2022 264/401 |
| 2006/0023065 A1 | 2/2006 | Alden | |
| 2006/0239588 A1* | 10/2006 | Hull | B33Y 50/00 382/285 |
| 2006/0249884 A1* | 11/2006 | Partanen | B33Y 10/00 264/401 |
| 2007/0257055 A1* | 11/2007 | Scott | B33Y 40/00 222/71 |
| 2007/0259066 A1* | 11/2007 | Sperry | B33Y 30/00 425/174.4 |
| 2008/0038396 A1* | 2/2008 | John | G03F 7/0037 425/174.4 |
| 2008/0054531 A1* | 3/2008 | Kerekes | B29C 67/0066 264/401 |
| 2008/0171284 A1* | 7/2008 | Hull | B33Y 10/00 430/252 |
| 2008/0226346 A1* | 9/2008 | Hull | B29C 64/106 399/177 |
| 2010/0166430 A1 | 7/2010 | Alten | |
| 2010/0328626 A1* | 12/2010 | Miyazaki | H04N 9/3114 353/85 |
| 2013/0304233 A1* | 11/2013 | Dean | A61L 27/50 623/23.72 |
| 2016/0033756 A1* | 2/2016 | Miller | G02B 26/0833 355/67 |
| 2016/0200042 A1* | 7/2016 | Jeng | B29C 67/007 264/401 |
| 2017/0028647 A1* | 2/2017 | Chao | B29C 67/0088 |
| 2017/0102679 A1* | 4/2017 | Greene | G05B 17/02 |

FOREIGN PATENT DOCUMENTS

| | | |
|---|---|---|
| CN | 103917348 | 7/2014 |
| EP | 2 120 455 | 11/2009 |
| JP | A2002335471 | 11/2002 |
| JP | A2007316660 | 12/2007 |
| JP | A2008139700 | 6/2008 |
| JP | 2010 224374 | 10/2010 |
| WO | WO 2012/125756 | 9/2012 |

* cited by examiner

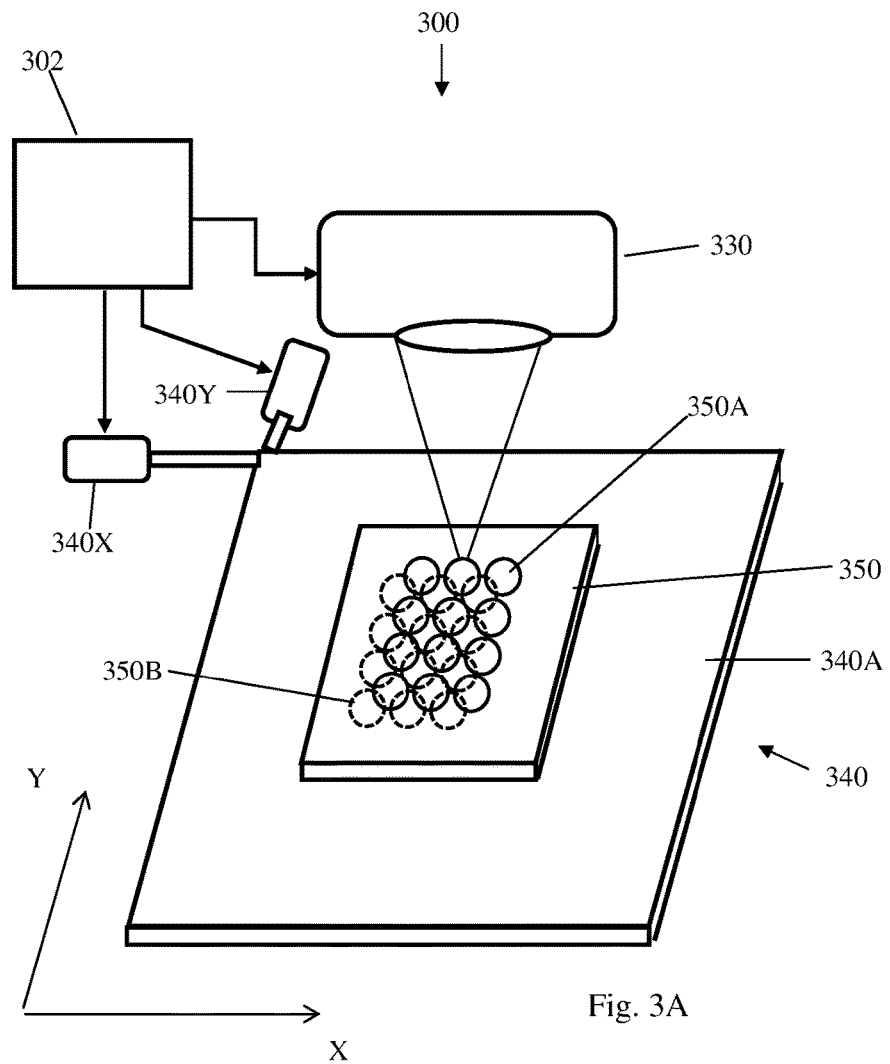
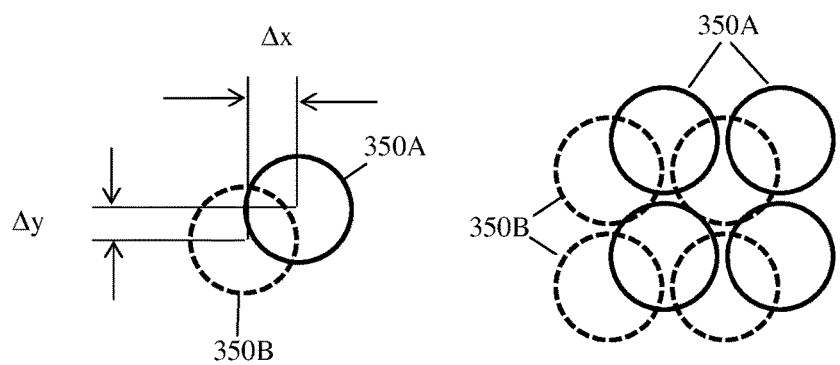
Fig. 3C  Fig. 3B
Fig. 3A

ENHANCED RESOLUTION DLP PROJECTOR APPARATUS AND METHOD OF USING SAME

CROSS-REFERENCE TO RELATED APPLICATIONS

This application is a divisional of U.S. patent application Ser. No. 14/774,142, filed Sep. 10, 2015, claiming the benefit to National Phase Application of PCT International Application No. PCT/IL2014/050275, International Filing Date Mar. 13, 2014, claiming priority of Provisional Patent Application No. 16/782,475, filed Mar. 14, 2013, which are hereby incorporated by reference in their entireties

BACKGROUND OF THE INVENTION

The present invention relates to selective radiation projection systems. More particularly, the present invention relates to Digital Light Processing (DLP) projector systems that are used for selective radiation exposure.

In DLP projectors, the image is created by microscopically small mirrors laid out in a matrix on a semiconductor chip, known as a Digital Micromirror Device (DMD). Each of these mirrors can be repositioned rapidly to reflect light either through the projecting lens onto a display or onto a light sink, i.e. light dump. Rapidly toggling a micromirror between these two orientations (essentially on and off) produces grayscales on the display, controlled by the ratio of on-time to off-time. Each micromirror typically represents one pixel in the projected image, and the number of micromirrors typically corresponds to the resolution of the projected image. 800×600, 1024×768, 1280×720, and 1920×1080 (HDTV) matrices are some common DMD sizes which are used today in DLP projectors. The common price of a typical DLP projector today depends greatly on its optimal resolution.

US application publication no. 2006/0023065 to Ray Alden discloses a method for multiplying the resolution of a display. In an iterative process, a DLP projector projects a first image which is directed to a first quadrant of a display screen, a second image which is directed to a second quadrant of the display screen, a third image which is directed to a third quadrant of the display screen, and a fourth image which is directed to a fourth quadrant of the display screen. Each of the four images comprises a quarter of a full high resolution image which are by this prolonged process tiled together to comprise one high resolution image.

SUMMARY OF THE INVENTION

A DLP projector apparatus for projecting a monochromatic display according to embodiments of the present invention is disclosed comprising at least three light sources, each capable of radiating a monochromatic light beam, at least one light sink for capturing at least some of said monochromatic light beams, at least one projection lens for refracting and projecting at least some of said monochromatic light beams for display, at least one DMD chip for selectively reflecting at least some of said radiated monochromatic light beams from said at least three light sources towards said projection lens for refracting and projecting said monochromatic display, said display comprising images of said at least three light sources and a control unit to control the activation of each of said at least three light sources in synchronization with said DMD chip.

The DLP projector apparatus according to some embodiments is operable so that said monochromatic display of said radiated at least three light sources are defocused to display said images shifted with respect to each other on a defocused imaging plane.

According to some embodiments the DLP projector apparatus is operable so that said images of said at least three light sources are shifted from each other along a first and a second reference axis by distance that is shorter than the diameter of said images of said at least three light sources.

According to some embodiments the DLP projector apparatus is operable so that said at least three light sources and said at least one DMD chip operate synchronously to apply separate and independent amount of radiation at said images at said defocused imaging plane.

According to some embodiments the DLP projector apparatus is operable so that said separate and independent amount of radiation at said images on said defocused imaging plane is controlled by said control unit executing production according to a production file.

According to some embodiments the DLP projector apparatus further comprising a layer of radiation-curable flowable build material at said imaging plane, said layer of radiation-curable flowable build material is curable by said radiation.

According to some embodiments of the present invention a DLP projector apparatus for projecting a monochromatic display is disclosed, comprising at least one light source capable of radiating a monochromatic light beam, at least one light sink for capturing at least some of said monochromatic light beam, at least one projection lens for refracting and projecting at least some of said monochromatic light beam for display, at least one DMD chip for selectively reflecting at least some of said radiated monochromatic light beam from said light source towards said projection lens for refracting and projecting said monochromatic display, said display comprising images of said at least three light sources, and an imaging table capable of moving in two perpendicular Cartesian axes, said axes substantially perpendicular to said display light beam. The DLP projector apparatus is operable so that the movement of said image base table along any one of said Cartesian axes is controllable to provide movements of less than or equal to half of the size of the image of said light beam reflected from a single micromirror of said DMD on said table.

According to some embodiments the DLP projector apparatus further comprising a layer of radiation-curable flowable build material at said imaging table, said layer of radiation-curable flowable build material is curable by said radiation.

According to some embodiments the DLP projector apparatus is operable so that second radiation scheme is shifted with respect to said first radiation scheme along a first and a second perpendicular axes by shift magnitudes substantially equal to half the diameter of an image of said at least three light sources reflected from a single micromirror of said DMD.

According to some embodiments the DLP projector apparatus is operable so that the radiation of said first and said second radiation schemes and the movement of said imaging table are controlled and synchronized by said control unit according to data in a production file of a 3D object.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3A schematically presents a system for high resolution imaging, according to embodiments of the present invention;

FIGS. 3B and 3C schematically present an enlarged partial radiation scheme of a produced object and respective distance scheme, respectively, according to embodiments of the present invention;

Figures 1, 1A:
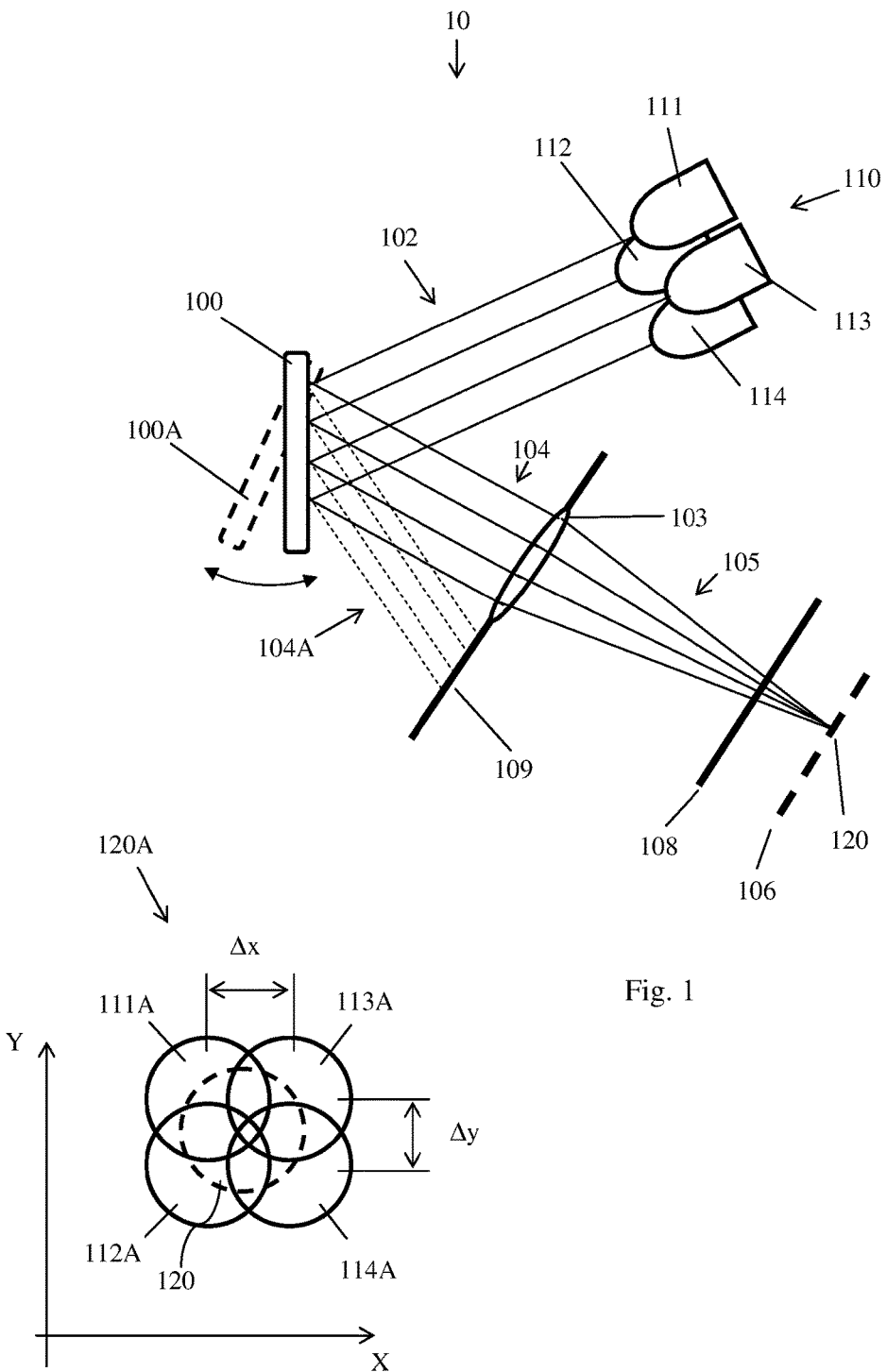
FIG. 1 is a schematic diagram of a Light-Emitting Diode (LED) based Digital Light Processing (DLP) projector adapted to illuminate a single imaging location, according to embodiments of the present invention.
FIG. 1A schematically presents a defocused image as imaged on a defocused image plane, according to embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

FIG. 1 is a schematic diagram of a Light-Emitting Diode (LED) based Digital Light Processing (DLP) projector 10 adapted to illuminate a single imaging location, according to embodiments of the present invention. DLP projector 10 is adapted to illuminate an imaging location by illumination unit 110 comprising multiple light sources 111, 112, 113, 114, presented in a simplified example. The term "DLP" projector is used hereinafter to include any projector using a Digital Micromirror Device (DMD). In this example, DLP projector 10 may be adapted to produce a color image, in which case the colors may be produced by using 4 individual light sources Red, Green, Blue, and White, i.e. RGBW LEDs, which may correspond to light sources 111, 112, 113 and 114 respectively, to produce the primary display colors: red, green, blue, and white. Each of the single light beams in light beam 102, from any of the light sources 111-114 is typically first mirrored by mirror 100 thus producing mirrored light beam 104, and then refracted by the condenser lens 103, thus producing condensing light beam 105, so as to focus the different light beams on focus plane 106. In some of the cases a light tunnel may be added between the condenser lens and the DMD (not shown in FIG. 1) to further focus the separate light beams together on the DMD for creating an image display. In the diagram, for the sake of brevity, only a single micromirror 100 is shown, capable of projecting a single displayed "color" (i.e. multi-source) pixel 120, which consists of its 4 separate light beams 111, 112, 113 and 114. In case the separate light beams consist of a known set of base color light sources, such as Red, Green, Blue and White, image pixel 120 will be a color pixel, having the color resulting from the intensity blend of the separate base color light sources.

Reference is made now also to FIG. 1A, which schematically presents a defocused image 120A as imaged on defocused image plane 108, according to embodiments of the present invention. The term 'defocused' here is meant to describe situation where an image plane is placed off, or slightly shifted from, the focus plane and the resulting image is not focused. Defocused image plane 108 is an imaging plane intentionally placed slightly out of focus of lens 103. Defocused image 120A, as depicted in FIG. 1A, is enlarged and repositioned for the sake of brevity as well. In DLP projector 10 each micromirror of the DMD device, such as micromirror 100, is synchronized with each of the light sources 111-114 to reflect its light beam onto lens 103 or to deflect its light beam away from lens 103 onto light sink 109, when the light source is turned on. The term "reflect" is meant to include hereinafter the operation of directing the emitted light beam from a light source to projecting lens 103 for projection. The term "deflect" is meant to include hereinafter the operation of directing the emitted light beam from the light source away from projecting lens 103, such as directing the light beam from the light source towards light sink 109, as represented by deflected beam lines 104A, i.e. light dump. The light beams emitted from the light sources and reflected to projecting lens 103 are typically projected for displaying a light projected image. For example, in FIG. 1, if LED 112 emits a green light beam, and the micromirror 100 reflects its light beam to projecting lens 103 the green display of pixel 120 is lighted. Micromirror 100 may be rapidly toggled between reflecting position (presented in solid line) and deflecting position (presented in dashed line and marked 100A). Rapid toggling of micromirror 100 produces shades of the illuminating source. The degree of shade (i.e. whether having high intensity or low intensity), is controlled by the ratio of on-time to off-time, also known as duty cycle. Therefore micromirror 100 can be rapidly toggled each time to reflect each of the separate light sources, each in its turn, 111, 112, 113 and 114, for displaying its designated display of blend of sources in image pixel 120. The separate sources are thus displayed sequentially at a sufficiently high rate that the observer sees a composite "full blend" image and in case the separate light sources are base colors—a composite "full color" image.

In known DLP projectors the number of micromirrors corresponds to the available resolution of the projected image, and the resolution of the DLP projector is typically limited by the size of its DMD. The price of DLP projectors may rise non-linearly as the available resolution grows.

Examples of suitable commercially available DMDs may include those under the trade designation "DIGITAL LIGHT PROCESSING" mirrors from Texas Instruments Inc., Piano Tex., USA.

When the image plane is placed defocused, as is image plane 108, the separate images 111A, 112A, 113A and 114A of light sources 111, 112, 113 and 114, respectively will be imaged defocused, forming defocused image 120A. Separate images 111A, 112A, 113A and 114A are located slightly away from each other, in defocused image plane having X and Y Cartesian coordinates, as depicted in FIG. 1A. The deviation of defocused images 111A-114A may be expressed by the deviation Δx along the X axis and deviation Δy along the Y axis. Image 120 in FIG. 1, drawn in dashed line, represents the location of the combined focused image of light sources 111-114 in the focus plane, relative to defocused images 111A-114A.

Light sources 111-114 may be, according to an embodiment of the invention, UV monochrome radiating light sources. In this embodiment, DLP projector 10 may be a modified DLP such as Optoma EX755e by Optoma Europe Ltd., UK, where its 4 light sources may be LEDs such as PhlatLight LEDs or Luminus CBT 120 UV, both made by Luminus Devices Inc., MA, USA, which are all adapted to radiate a similar monochromatic light with variance that does not exceed 50 nm wavelength, according to one embodiment. According to one embodiment, the light emitted from LEDs 111-114 has a wavelength of between 250 nm-450 nm. In one embodiment, condenser lens 103 may be smoothed or may be replaced by another lens (not shown) which may refract the light beams from LEDs 111-114 differently. In this embodiment the refraction lens is intended to refract the monochromatic light beams to the DMD while slightly separating the projected monochromatic light beams in order to display 4 distinguishable images 111A-114A. In other embodiments the condenser lens 103 may be discarded, or other known optic means may be used for refracting the light beams from LEDs 111-114 to the DMD while slightly separating the projected monochromatic light beams in order to display 4 distinguishable images 111A-114A. The distinguishable images 111A-114A may overlap between themselves, as shown in FIG. 1A, and/or may overlap other neighboring images. Therefore each micromirror, such as micromirror 100, can effectively reflect or deflect the display of each of the 4 images 111A-114A, whether chromatic or monochromatic. In other words, each image may be displayed at a slightly different location with respect to the images of the other images, where each image may have different shade levels from full light to total dark. Thus, for example, a LED DLP color projector of 800×600 PPI resolution can be used, by replacing its chromatic light sources with monochromatic light sources according to an embodiment of the invention, as a monochrome projector of 1600×1200, enhancing the effective resolution by 4 for a monochromatic image relative to the original resolution of the projector. Accordingly, in one embodiment a color LED DLP projector of a prior art may be transformed into a monochromatic LED DLP projector of a higher resolution by replacing some or all of the color LEDs with LEDs having a similar color. In some of the cases alterations to the software running the DLP projector may be needed.

In one embodiment the light sources used are lasers such as L375POMLD 30 mw 375 nm Laser Diode, produced by ThorLabs Inc. of NJ, USA, having a wavelength of between 250 nm-450 nm. In other embodiments other light sources may be used.

In one embodiment, a monochromatic DLP projector comprises 4 light sources. The light sources may have different formations and numerous constructions and may be used with mirror(s) and/or lens(es) and/or other known optic means for manipulating and guiding the light beams of the light sources for creating the higher resolution monochromatic light image by locating the images of the different light sources on the imaging plane at different locations typically shifted from each other by substantially half the physical distance between two consecutive pixels of the original resolution of the DLP projector in both X and Y axes. Each of the light sources may be capable of radiating a monochromatic light similar to the other light sources, meaning that the variance between all the light sources does not exceed a defined bandwidth. In one embodiment the light sources have a wavelength of between 250 nm-450 nm. In another embodiment the light sources may have a wavelength of between 388 nm-405 nm. The monochromatic DLP projector may also comprise a DMD, a light sink and a projection lens. In some of the embodiments the DLP projector may also comprise a mirror for mirroring the light beams and may also comprise a lens for refracting the light beams onto the DMD. As described above, for each image, each of the light sources will be turned "on" at its turn in a sequence while the DMD selectively reflects its light beam of the intended image location of the image in full synchronization. The synchronization may be controlled by a control unit of the DLP (not shown), which may be modified or adapted to radiate the amount of illumination of each of the plurality of light sources onto the respective intended imaging location in coordination with the other light sources of the lighting unit of the DLP projector. Accordingly, a DLP projector with four light sources may, according to embodiments of the present invention, project four neighboring locations, each radiated with its separate respective amount of radiation, instead of radiating of a single location (i.e. a single pixel) by the four separate light sources by the DLP according to prior art operation.

The DMD matrix size, expressed by the number of micromirrors, (i.e. the original resolution) may be 800×600, 1024×768, 1280×720, 1920×1080, or any other matrix size. The reflected light beam from each micromirror may then be directed to the projection lens for refracting the light and projecting it to the intended location on the image placed at the image plane, which is at the focus plane according to the known art. Thus the lens projects the light beams to their intended pixels. A monochrome DLP projector having a single DMD and operating according to embodiments of the present invention can display a sequence of images each having, for a DLP with four light sources, a resolution four times higher than the original resolution of the DLP. In one embodiment the monochromatic DLP projector can be used for displaying images having separate images of the separate light sources which have different shades of the same color. Different intensity levels of a single color are sometimes referred to in the art as grayscales of that color although any color may be used in this projector such as Blue, UV, etc. In other embodiments the monochromatic DLP projector may be used for displaying images having illuminated locations of only 2 shades: light or dark.

In one embodiment, instead of four monochromatic light sources only 3 monochromatic light sources may be used in the described monochromatic DLP projector. In this embodiment the original resolution of the DLP projector may be thus multiplied by 3.

In one embodiment the distances between the light sources may range from about 0.5 millimeters to about 5 millimeters, and may vary depending on the focus pathways of the emitted light.

In one embodiment the described enhanced resolution monochromatic DLP projector may be used for building 3D objects in additive manufacturing printer systems. The 3D object may be built from a Computer-Aided Design (CAD) model in a layer-by-layer manner by extruding a radiation-curable flowable build material and then selectively exposing portions of it to radiation in accordance with the build data. The build material may be a radiation-curable material that is soluble in a solvent (e.g., water-soluble) while in the uncured state. Curing of the build material is done by radiating the locations on the layer of build material which should remain in the produced model. The radiation may be of any type, or in any wavelength that causes curing of the build material while the amount of radiation provided to each location on the built model should be the amount that ensures sufficient curing in that location. Thus, upon curing, e.g. exposure to UV light, the radiated material becomes substantially insoluble in the solvent. The product is then treated with a solvent which dissolves and washes away the un-radiated superfluous material.

Figure 2:
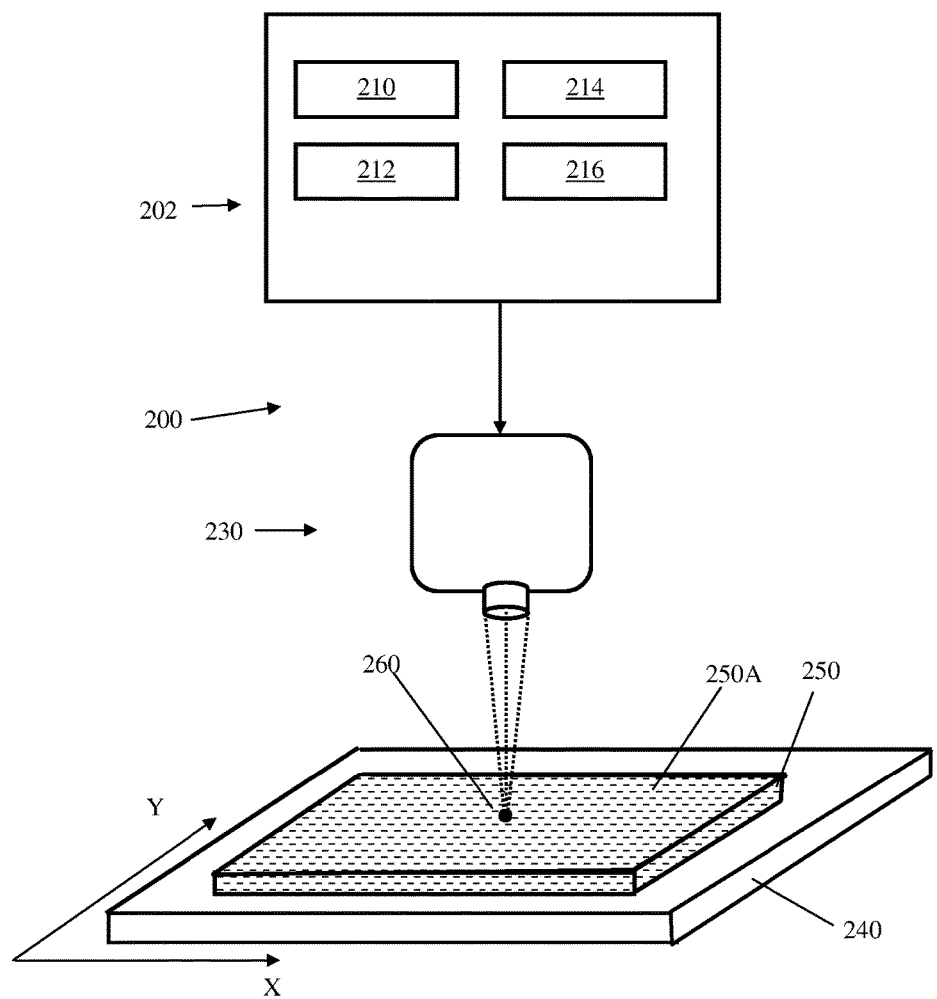
FIG. 2 schematically presents a system for building 3D objects according to embodiments of the present invention.

Reference is made now to FIG. 2, which schematically presents system 200 for building 3D objects according to embodiments of the present invention. System 200 comprises control unit 202, DLP projector 230 and production table 240. Control unit 202 may be any suitable computer, programmable logic controller (PLC), processor and the like, that may be adapted to receive and store production digital files and to provide, based on the production files, production control commands to DLP projector 230, in order to radiate a produced object 250 placed on production table 240 according to the production scheme. Control unit 202 may comprise processing unit 210, non-transitory storage unit 212, peripheral interface unit 214 and user interface unit 216. Non-transitory unit 212 may be any suitable memory unit that is adapted to store program software, operation parameters, temporary data and production files. Peripheral interface unit 214 may be adapted to enable active communication of control unit 202 with DLP projector 230, with other systems via dedicated communication channels or via network for example in order to receive production files, as is known in the art. User interface unit 216 may provide or support user interface means such as display unit to display data, instructions and status to a user, keyboard and/or touch screen to enable a user to enter data, to select modes of operation and the like. According to an embodiment a production file stored in storage unit 212 may be loaded onto processor 210 for execution in order to provide radiation controls to DLP projector 230. According to an embodiment of the present invention production data included in production files may be transferred by control unit 202 from storage unit 212 to DLP projector for execution by DLP projector 230. According to embodiments of the present invention production commands are translated to a radiation scheme adapting an amount of radiation for each radiation location on the work surface 250A of produced object 250. The momentary location which is radiated is marked 260. According to embodiments of the present invention the number of available radiation locations may be greater than the original resolution of DLP projector 230 by the number of light sources of DLP projector 230. In such additive manufacturing printer systems the build data is obtained by initially slicing the CAD model of the 3D object into multiple parallel sliced layers. Then, for each sliced layer, the host computer, such as control unit 202, generates a radiation map for selectively radiating the build material to form the 3D object.

The radiation-curable building material may be extruded through a nozzle carried by an extrusion head (not shown), and be deposited as a layer on a substrate in an x-y plane such as production table 240. After a new layer is deposited DLP projector 230 can selectively radiate portions of this layer, such as layer 250A, of the deposited material, according to the build data. The deposited material solidifies upon a drop in temperature, after which another layer is then deposited and radiated similarly, where the extruded build material fuses to a previously deposited layer. The position of the extrusion head relative to the base may be incremented along a z-axis (perpendicular to the x-y plane), and the process of depositing and radiating is repeated for a number of layers, according to the build data. The resulting model consists at this stage, in each of the layers, of partly radiated material which is substantially insoluble in a solvent and partly un-radiated material which is soluble in the solvent. The model may then be placed in a bath containing a solvent, which dissolves the un-radiated material away from the radiated material—effectively creating a 3D object resembling the CAD model. Therefore a higher resolution projector can selectively radiate the layers of the deposited material in a higher resolution which effectively can allow the creation of higher resolution 3D objects.

Examples of suitable x-y resolutions for exposure include resolution sizes of about 170 micrometers/dot or less (i.e., at least about 150 dpi), with particularly suitable resolution sizes including about 85 micrometers/dot or less (i.e., at least about 300 dpi), and with particularly suitable resolution sizes including about 50 micrometers/dot or less (i.e., at least about 500 dpi). Accordingly, the combination of the high-speed deposition and the high x-y resolution exposure to light allows 3D object to be formed with reduced build times while also retaining good part resolution.

For example, for radiation-curable materials provided as filament strands, suitable assemblies for material supply are disclosed in U.S. Pat. No. 6,923,634 and US 2005/0129941.

In one embodiment the described high resolution monochromatic DLP projector may be used for creating printed circuit boards (PCBs) that are prepared using photo-imaging technology. A photoresist composition is applied to a substrate, for example a flexible or rigid substrate comprising a copper surface. Then, according to an embodiment, the board is exposed to a monochromatic DLP projector described above which displays a monochromatic image for direct imaging to selectively react (for example crosslink) the photoresist composition which makes up the desired circuit pattern. The exposed board may be developed by spraying with a water-alkaline solution to remove the unreacted photoresist composition. The copper which is no longer covered by photoresist composition is etched from the substrate by means of cupric chloride or ammonium chloride and at last preferably the reacted photoresist composition is stripped from the remaining copper to provide the printed circuit board. The described monochromatic DLP projector may be used with other techniques and methods used in the production of the PCBs which require using photo-imaging technology.

In another embodiment the described high resolution monochromatic DLP projector may be used for manufacturing offset printing plates. Offset printing plates may be manufactured by using the high resolution DLP projector for projecting an image on the printing plate surface.

Reference is made now to FIG. 3A which schematically presents DLP projector apparatus 300 for high resolution imaging, according to embodiments of the present invention. DLP projector apparatus 300 comprises control unit 302, DLP projector 330 and imaging table 340. Control unit 302 may comprise a processing unit, a non-transitory storage unit, a peripheral interface unit and a user interface unit (not shown) similarly to control unit 202 described above. The non-transitory unit may be any suitable memory unit that is adapted to store program software, operation parameters, temporary data and production files. The peripheral interface unit may be adapted to enable active communication of the control unit with DLP projector 330, with imaging table 340 and with other systems via dedicated communication channels or via network for example in order to receive production files, as is known in the art. The user interface unit may provide or support user interface means such as display unit to display data, instructions and status to a user, keyboard and/or touch screen to enable a user to enter data, to select modes of operation and the like. According to an embodiment production file stored in the storage unit may be loaded onto the processor for execution in order to provide radiation controls to DLP projector 330 and to imaging table 340.

DLP projector 330 may be any suitable projector known in the art with a given imaging resolution $I_{RES}$ expressed, for example, by the $A_X \times A_Y$ array size representing the number of available imaging locations along the X and the Y axes of an image the size of $L_X$ by $L_Y$, presented in any length units. As a result the resolution may be also presented by the dots per length (e.g. dots per inch (DPI)) the imaging resolution of DLP projector 330 may provide. Typically the basic imaged area (sometimes called pixel) has similar or equal size along the X and the Y axes of the image and therefore the DPI figure $DLP_{DPI}$ of a projector may be obtained by the division of $L_X/A_X$ or $L_Y/A_Y$ when the lengths $L_X$, $L_Y$ are expressed in Inches. The original resolution of DLP projector 330, $I_{RES}$, may provide imaging of $A_X \times A_Y$ locations (or pixels), separated from each other by $25.4/DLP_{DPI}$ [mm]. DLP projector apparatus 300 further comprises imaging table 340 comprising imaging plate 340A moveable along a dual-axes reference frame X-Y by X actuator 340X and Y actuator 340Y adapted to separately and independently move imaging table 340A along their respective axes. The X-Y plane of imaging table 340A is substantially perpendicular to the direction of projection of DPL projector 330.

Imaging table 340 may be adapted to move smoothly and accurately along X and Y axes depicted in FIG. 3A. The movements of imaging table 340 are carried out by actuator 340X and actuator 340Y, respectively, which are adapted to provide incremental movements as small and accurate as may be required, in response to movement commands provided by control unit 302. Actuators 340X and 340Y may be any known actuators capable of providing the required accuracy and range of movement such as linear electrical pistons or the like.

According to embodiments of the present invention a high-resolution imaging process may be carried out using a DLP projector with lower original resolution. Initially a produced object 350 that is to be imaged as part of its production process, as described above with respect to model 250, may be placed on imaging table 340. Imaging table 340 may be located at an initial location having initial coordinates $X_{INIT}$, $Y_{INIT}$. Produced object 350 may now be radiated according to a first radiation scheme as included in the object's production file stored in control unit 302, in a first fly. The resolution of the image radiated in the first fly equals to the original resolution $I_{RES}$.

Reference is made now to FIGS. 3B and 3C which schematically present an enlarged partial radiation scheme of a produced object and respective distance scheme, respectively, according to embodiments of the present invention. According to embodiments of the present invention high resolution DLP projector apparatus 300 may apply radiations schemes in more than one fly, for example in two flies. In FIGS. 3A, 3B and 3C the location of imaging of a produced object according to a first radiation scheme is presented by solid line circles 350A and the location of imaging of a produced object according to a second radiation scheme is presented by dashed line circles 350B. The distance between any two neighboring imaging locations of a certain radiation scheme—the first or the second—is derived from the original resolution $I_{RES}$ of the DLP projector. In order to achieve higher imaging resolution the produced object 350 may be moved with respect to reference frame X-Y and with respect to DLP projector 330 at any suitable time of the imaging process by Δx along the X axis and by Δy along the Y axis and then a second imaging scheme may be applied onto produced object 350, as depicted by dash-line circles 350B. The combined imaging scheme of the first and the second imaging schemes is a double-resolution imaging scheme, as seen in FIGS. 3B and 3C. It will be appreciated that the dimension of Δx and Δy may be set as required, for example Δx and Δy may be set to half the distance between neighboring imaging location of a single imaging scheme.

Figure 4:
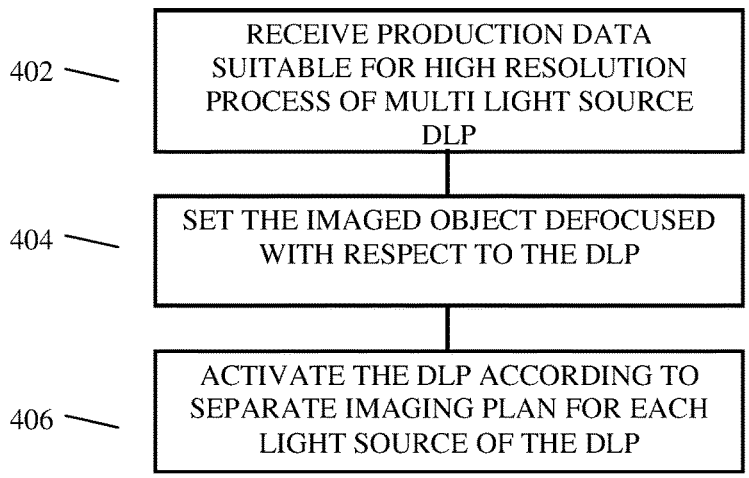
FIG. 4 is flow diagram depicting high resolution imaging process according to embodiments of the present invention.

Reference is made now to FIG. 4 which is flow diagram depicting a high resolution imaging process according to embodiments of the present invention. The imaging process depicted in FIG. 4 may be carried out by a high resolution imaging system such as system 200 of FIG. 2. Production data may be received for example in the form of production data file stored in control unit 202 (block 402). A production plane with production model may be placed off-focus with respect to the DLP projector, such as DLP projector 230 (block 404). The DLP projector may be activated to apply the imaging scheme of the production plan by applying separate imaging instructions to each of the light sources of the DLP projector (block 406). The high resolution imaging process ends at the end of the imaging plan and the model may be moved to the next production step.

Figure 5:
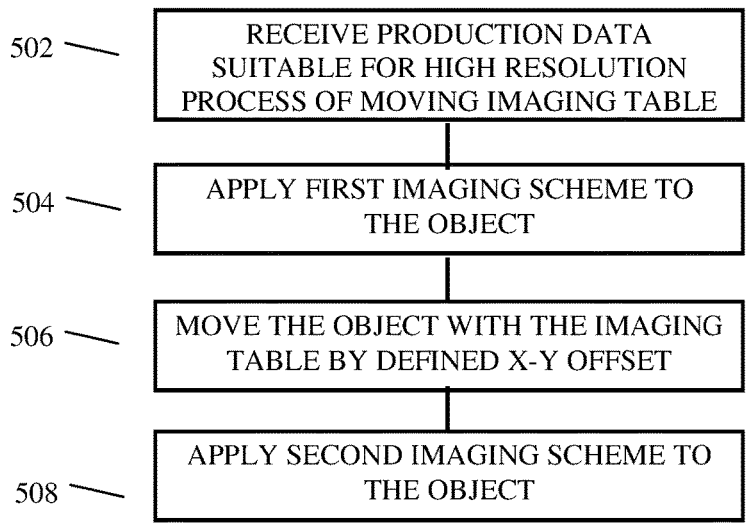
FIG. 5 is flow diagram depicting high resolution imaging process according to embodiments of the present invention.

Reference is made now to FIG. 5, which is flow diagram depicting a high resolution imaging process according to embodiments of the present invention. The imaging process depicted in FIG. 5 may be carried out by a high resolution imaging system such as DLP projector apparatus 300 of FIG. 3A. Production data may be received for example in the form of production data file stored in control unit 302 (block 502). A first imaging scheme is applied onto the produced object (block 504). At the end of the first imaging scheme, or in a reciprocal manner the produced object may be moved with respect to the DLP projector by defined Δx and Δy (block 506). A second imaging scheme may be applied onto the produced object (block 508). This process may proceed until the entire imaging plan has been carried out.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for building three dimensional (3D) objects comprising:
   a system control unit;
   a production table; and
   a DLP projector having a first resolution configured to selectively irradiate a layer of radiation-curable material positioned at a defocused image plane with respect to the DLP projector at the production table so as to provide an image of a second resolution, which is higher than the first resolution of the DPL projector, the DLP projector comprising:
      at least three light sources to radiate monochromatic light beams capable of curing the radiation curable material, the light beams having a variance that does not exceed 50 nm wavelength;

at least one light sink for capturing at least some of said monochromatic light beams;

at least one projection lens for refracting and projecting at least some of said monochromatic light beams;

at least one DMD chip for selectively reflecting at least some of said radiated monochromatic light beams from said at least three light sources towards said defocused plane; and a synchronization control unit to control the activation of each of said at least three light sources in synchronization with said DMD chip.

2. The system of claim 1, wherein images of said at least three light sources on the defocused image plane are shifted from each other along a first and a second reference axis by distance that is shorter than a diameter of said images.

3. The system of claim 1, wherein said at least three light sources and said at least one DMD chip are adapted to operate synchronously to apply separate and independent amount of radiation at said defocused image plane.

4. The system of claim 3, wherein said separate and independent amount of radiation on said defocused image plane is controlled by said synchronization control unit executing production according to a production file.

5. The system of claim 1, wherein the production table is capable of moving in two perpendicular Cartesian axes, said axes substantially perpendicular to said light beams and wherein movement of the production table along any one of said Cartesian axes is controllable to provide movements of less than or equal to half of the size of the image of one of said light beams reflected from a single micrometer of said DMD chip on said production table.

* * * * *